United States Patent [19]

Slivinsky et al.

[11] 4,328,410
[45] May 4, 1982

[54] LASER SKIVING SYSTEM

[76] Inventors: Sandra H. Slivinsky, 739 Joyce St., Livermore, Calif. 94550; Norman E. Ogle, 832 Bryant St., Palo Alto, Calif. 94301

[21] Appl. No.: 936,566

[22] Filed: Aug. 24, 1978

[51] Int. Cl.³ .............................................. B23K 27/00
[52] U.S. Cl. ........................ 219/121 LJ; 219/121 LH; 219/121 LW; 219/121 LY
[58] Field of Search .... 219/121 LM, 121 L, 121 LG, 219/121 LH, 121 LJ, 121 LK, 121 LL, 121 LN, 121 LU, 121 LW; 346/76 L

[56] References Cited

U.S. PATENT DOCUMENTS

| | | | |
|---|---|---|---|
| 3,410,979 | 11/1968 | Larsson | 219/121 L |
| 3,435,186 | 3/1969 | Roshon, Jr. et al. | 219/121 L |
| 3,584,183 | 6/1971 | Chiaretta et al. | 219/121 L |
| 3,663,795 | 5/1972 | Myer | 219/121 L |
| 3,665,483 | 5/1972 | Becker et al. | 219/121 LH X |
| 3,742,182 | 6/1973 | Saunders | 219/121 LM |
| 3,786,224 | 1/1974 | Heywang et al. | 219/121 LM |
| 3,814,895 | 6/1974 | Fredriksen | 219/121 L |
| 3,832,948 | 9/1974 | Barker | 219/121 LM X |
| 3,965,327 | 6/1976 | Ehlscheid et al. | 219/121 LM |
| 4,009,364 | 2/1977 | Ladstädter | 219/121 L |
| 4,044,222 | 8/1977 | Kestenbaum | 219/121 LM |
| 4,081,653 | 3/1978 | Koo et al. | 219/121 LM |
| 4,131,782 | 12/1978 | Einstein et al. | 219/121 LM |
| 4,169,976 | 10/1979 | Cirri | 219/121 LM |
| 4,172,219 | 10/1979 | Deml et al. | 219/121 LM |

FOREIGN PATENT DOCUMENTS 242803  12/1971  U.S.S.R. .......................... 219/121 L

OTHER PUBLICATIONS

Gagliano, F. P., "Laser Beam Welder", *Western Electric Technical Digest*, No. 36, pp. 11–12, Oct. 1974.
Arrabito et al., "Laser Perforation Technique", IBM Technical Disclosure Bulletin, vol. 13, No. 10, Mar. 1971, p. 3098.
Kremen, "Laser Hole Making in Printed Circuit Boards", IBM Tech. Disc. Bull., vol. 8, No. 3, Aug. 1965, p. 434.

*Primary Examiner*—C. L. Albritton
*Attorney, Agent, or Firm*—Warren J. Krauss

[57] ABSTRACT

A process and apparatus for selectively removing a plastic layer laminated to a metal substrate. A high intensity laser beam is precisely directed to open areas of a thin metallic mask overlying the plastic layer. During removal of the plastic layer from the metal substrate, the system also removes the adhesive resin which attaches the layers. A movable table transfers the sample to be skived across the laser beam and the beam is caused to sweep the sample in a rotating pattern by means of a rotating wobble-plate mirror system. The plastic layer and the adhesive resin which attaches it to the metal substrate are removed by a sequential combination of vaporization and explosion processes.

8 Claims, 8 Drawing Figures

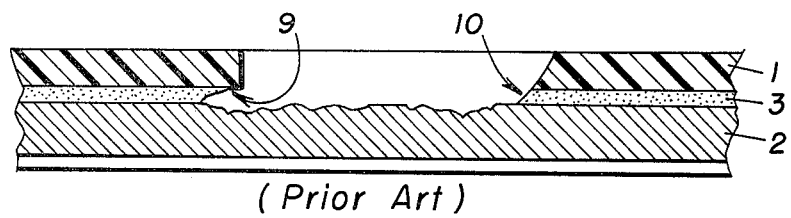
FIGURE 1.
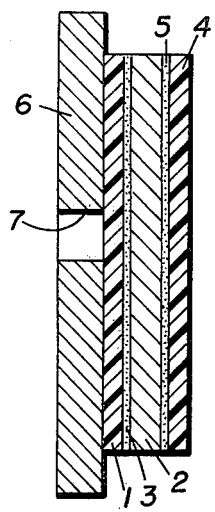
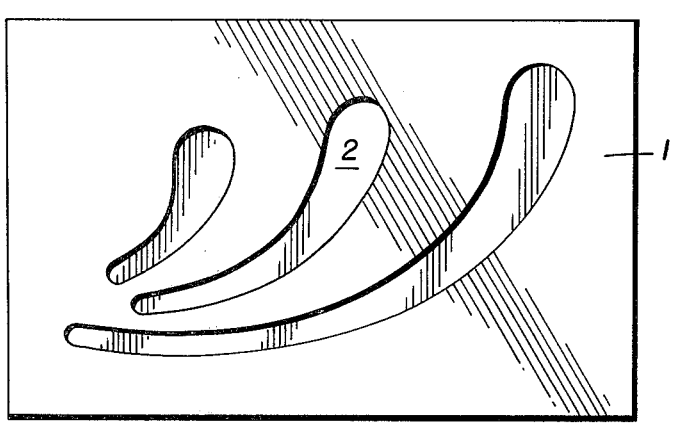
(Prior Art)
FIGURE 3.
(Finished Cut)
FIGURE 2.
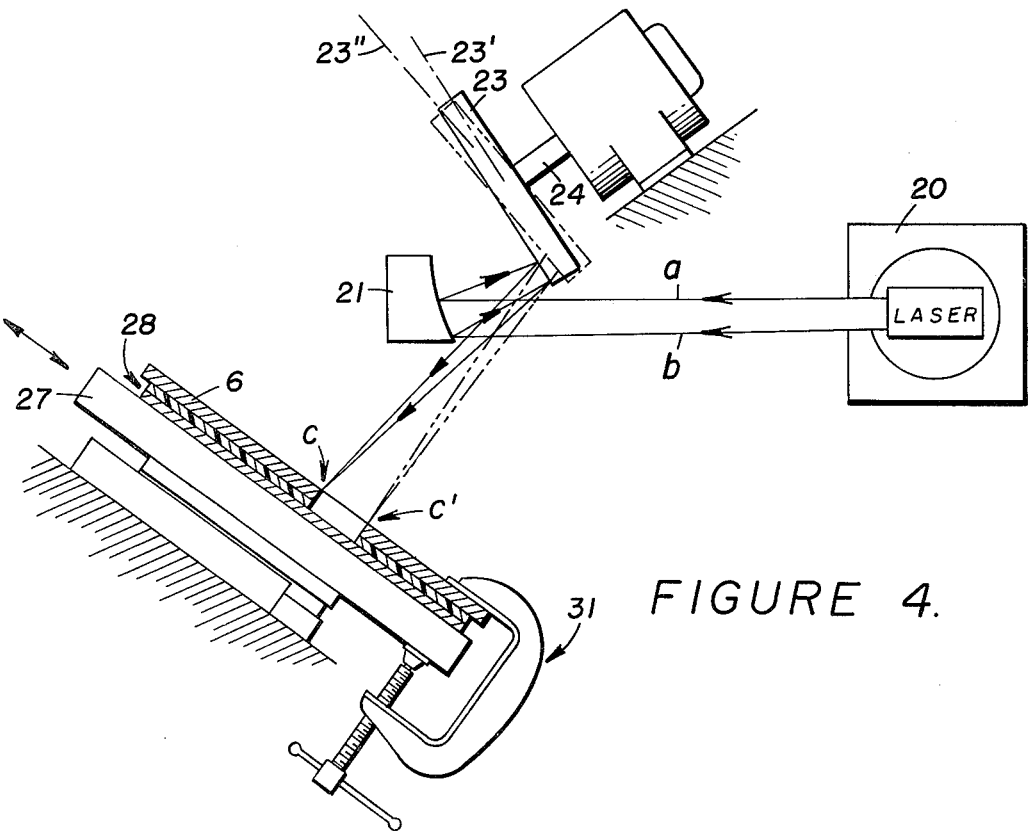
FIGURE 4.

LASER SKIVING SYSTEM

BACKGROUND OF THE INVENTION

This invention relates to an apparatus and a process for removing a laminated layer of non-metallic material from a metallic substrate with precision of depth and lateral dimension and without damage to the metallic substrate.

A fast and economic approach to the problem of stripping or skiving non-metallic layers from metallic substrates for various purposes has been long sought. For example, laminated flexible circuits consisting of the polyimide, known by the trademark Kapton, over FEP (fluorinated ethylene-propylene) Teflon adhesive over a copper substrate are widely utilized in electrical components by the electronics industries. A given circuit design may be produced from a blank laminated sample through the selective removal of portions of the non-metallic layers to expose bare copper. The precision required depends upon the particular application for the circuit and its electrical tolerances.

In the past, such selective removal of plastic laminate layers over metal substrates were produced in mechanical skiving operations. Such operations include a scribe or other cutting tool to physically penetrate the non-metallic layers and expose given amounts of the metallic substrate. Unfortunately, mechanical skiving has not been satisfactory where high precision and quality control are required. Unless extraordinary care is taken in a mechanical system, some portion of the metallic substrate can be is either scored or removed entirely along with the plastic cover layers. Such results are often variable and can lead to weakening or failure of the resultant circuit.

In addition to the difficulty in controlling the depth of cut in a mechanical skiving operation, the area, or lateral width of the cut, has also been a vexing problem. It has been extremely difficult to achieve a clean sharp edge in the plastic laminate at the cut boundary.

Starting with the premise that a metal substrate, such as copper, is more energy reflective in the infrared light region than a plastic laminate coating, a system has now been devised for virtually elminating the problems of precision depth and width skiving through the utilization of nonmechanical means for producing the skiving action.

The present invention utilizes a high intensity continuous wave $CO_2$ laser having a masked mirror-focused beam which is caused to nutate and expose selected areas of a masked sample mounted upon a translatable bed. The sample is exposed, for precisely calculated time intervals, to a linearly circularly sweeping high intensity beam which removes a non-metallic laminate over-layer through a combination of vaporization and explosion processes.

Numerous attempts have been made in the past for utilizing laser systems in drilling and cutting operations. For example, U.S. Pat. No. 3,832,948 to Barker discloses the utilization of a laser beam for selectively removing portions of a top layer from a laminated substrate. It should be noted, however, that the patented system is adopted for removing a thin metallic film over a plastic substrate and it relies upon the ability of the thin metal film to absorb visible or near visible laser light to create heat which breaks down the metallic structure. Barker discloses the use of a very lower power laser with which the problem of controlling lateral spread in the hole or cut produced is virtually non-existant. Also, in the Barker system one must alter the laser to utilize wave lengths in the infrared zone, which are absorbed by plastics, when removal of the plastic substrate is desired.

In contradistinction to the Barker system, the present invention comprises a one-step process for removing a plastic film over a metallic substrate with virtually no removal of the metallic substrate. Utilizing a high intensity laser, it operates through the absorption of infrared light by the plastic and through reflection of such light by the metal substrate to provide a combination vaporization and explosion removal of the plastic material in a precisely controlled area. The specialized purpose of this invention is to free selective metallic regions which are encapsulated in plastic for the purpose of making clean electrical connections without affecting surrounding plastic or metal.

An example of a prior art hole "punching" system, using a laser, is taught by U.S. Pat. No. 3,742,182 to Saunders. The Saunders device is capable of scanning across open areas of a mask to affect underlying surface material. Saunders discusses a method for scanning a laser beam in a circular path, but the disclosed technique is apparently adapted for boring or punching a hole through a thin piece of nonmetallic material. In Saunders, a binder material in a ceramic particulate base is vaporized and physically blown away from a hole by means of a jet of compressed air. The patentee states that his concern is producing holes in "sheets of non-homogenous material having finely divided particles held together by a binder".

Saunder's type systems would not be useful in the context of the present invention wherein the punching of holes through a non-homogenous material is not involved. A very precise system must be utilized when it is intended to remove select portions of a homogenous plastic coating over a metal substrate with no injury to the substrate and without external mechanical devices, such as pumps, to remove materials affected by the laser beam.

Unlike in the prior art system, the present invention utilizes a mask to assist in controlling the size, location, and shape of material being removed from a given area. Through the circular scanning of a laser beam within the confines of a given mask opening, the precise time and area of exposure of the beam to the plastic may be controlled. If one were to look microscopically at an area to be skived, the time of exposure of any given particle of plastic to the laser beam would be seen to be the same as that of any other particle. This is impossible with prior art systems.

In the present invention, a high powered laser, having a beam intense enough to vaporize and explode materials to be removed, is used. Only the vertical components of a nutating laser beam are used, with an exposure time interval brief enough that material which is not to be removed is "unaware" that the process is taking place.

Other prior art patents which are directed to certain per se aspects of the present invention are U.S. Pat. Nos. 3,965,327 and 3,786,224 to Ehlscheid et al. and Heywang et al., respectively.

SUMMARY AND OBJECTS OF THE INVENTION

The instant skiving system comprises a high intensity laser source which directs a beam to a fixed off-axis parabolic mirror which in turn directs the beam to a skew mounted rotating flat mirror which produces and precisely directs a nutating beam of energy through open areas of a mask onto a determined portion of plastic material over a metal substrate. Exposure of the plastic material and an adhesive resin material which binds the plastic to the metal substrate causes tremendous instantaneous absorption of heat energy by both the resin and the plastic. The resin material absorbs more infrared light than the plastic layer and gives off gases as it vaporizes which gases are entrapped between the metal substrate and the plastic layer. At a precise time, when the plastic layer has absorbed enough heat to substantially vaporize and when the entrapped gases from the binder layer have built in pressure, they "explode" through the weakened plastic layer, thus cleaning all plastic from the area precisely demarked by the mask.

The primary object of the present invention is to provide an apparatus and process for quickly, efficiently, and economically removing precisely demarked areas of a plastic layer over a metal substrate.

Another object of the present invention is to provide an apparatus having means for automatically and controllably nutating a beam of laser light for the precision direction of such beam upon a plastic layer.

A further object of the present invention is to provide an apparatus having means for automatically linearly moving a sample to be skived in relation to a nutating laser beam for precise control of skiving area and depth.

Other objects and advantages of the present invention will become apparent from the following drawings and description.

The accompanying drawings show, by way of illustration, the preferred embodiments of the present invention and the principles thereof. It should be recognized that other embodiments of the invention, applying the same or equivalent principles, may be used and that structural changes may be made as desired by those skilled in the art without departing from the spirit of the invention.

BRIEF DESCRIPTION OF THE DRAWINGS

FIG. 1 is a sectional view of a plastic over metal substrate flexible circuit sample, the skiving of which is the subject of this invention;

FIG. 2 is a plan view of the circuit component of FIG. 1 showing a typical circuit pattern which results from the removal of the plastic layer from the copper substrate;

FIG. 3 is a sectional view of a circuit component, the plastic of which has been skived by a prior art method;

FIG. 4 is a schematic plan view of the present laser skiving system showing the major components thereof;

DETAILED DESCRIPTION

Figure 4A:
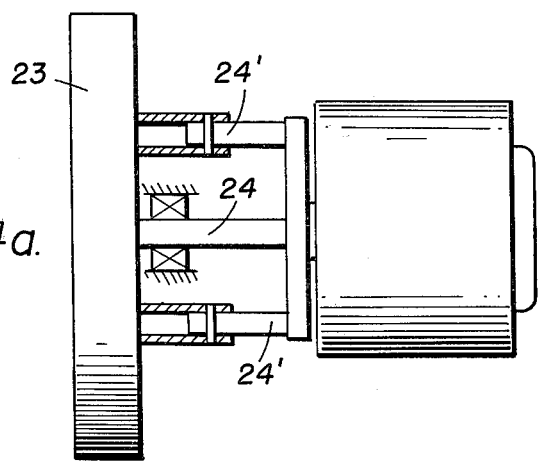
FIG. 4a is a view showing an alternate mirror mounting arrangement.

With reference to FIG. 1 in the drawings, the purpose of and the materials upon which the present invention is intended to act may be appreciated. FIG. 1 illustrates a typical flexible electric circuit component comprised of a plurality of layers of disparate materials. A plastic cover layer 1, such as Kapton, is bonded to a copper circuit layer or substrate 2 by means of an adhesive resin material 3, such as FEP Teflon. The copper layer is similarly protected on its reverse side by plastic and bonding layers 4 and 5 respectively. The present system is designed to remove layers 1 and 3 from certain select areas to expose portions of the copper substrate 2 to provide a predictable circuit pattern, such as shown in FIG. 2. FIG. 1 also shows a portion of a metallic mask layer 6, fabricated of aluminum, steel or like material, having an open area 7 corresponding in dimension to the areas of plastic to be removed.

FIG. 2 shows a plan view of an electric circuit component from which the layers 1 and 3 have been removed exposing the copper substrate 2 in precise circuit paths.

FIG. 3 shows an enlarged cross-section view of layered component, similar to that shown in FIG. 1, from which the Kapton and Teflon layers have been removed from the copper substrate by prior art methods. It may be noted that the copper substrate surface is irregular and depressed, indicating that some destruction of the copper substrate has occurred. It may also be noted that the lateral edges of the cut area are not regular. On the lefthand side 9 of the skive area some plastic remains and extends, cantilever fashion, beyond the confines of the copper and Teflon areas therebeneath. In early experiments with the present invention using fixed beam systems, laser "spray" or lateral dispersement of heat energy and vaporization of materials caused such a result. On the right-hand side of the figure, at 10, it may be noted that the cut is not a precise vertical line but is rather a gradual slope from the top surface of the plastic layer down to the copper substrate. Such a result, possibly caused by a non-vertical beam angle, would be totally unacceptable in a precision circuit requiring exacting tolerances.

Figure 6:
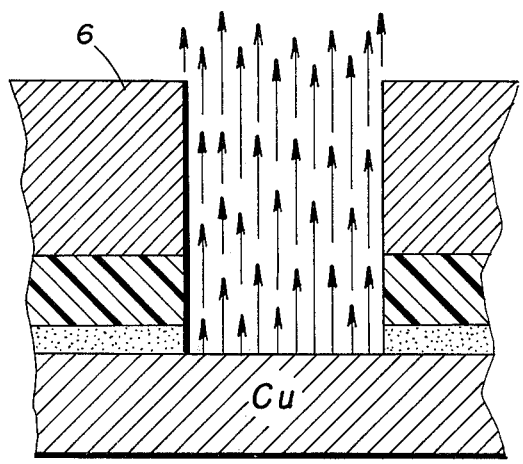
FIG. 6 is a greatly enlarged sectional view of a material sample shown at the moment of resin explosion and removal of the plastic layer.

With respect to FIG. 4, the major components of the present apparatus which produces precise plastic skiving, such as that shown in FIGS. 2 and 6, may be appreciated. At 20, is schematically shown a high intensity continuous wave $CO_2$ gas transport laser source capable of laser intensities on the order of $7.73 \times 10^4 W/cm.^2$. The beam, the width of which is demarcated by the arrows shown, is emitted from the laser source to a reflective device such as a fixed parabolic mirror of glass or other suitable material 21. At 23, a flat mirror surface comprised of polished aluminum is provided. The mirror is fixed upon an axle 24 of an electric motor capable of a range of speeds from 0 to 2,000 r.p.m. The mirror 23 is fixed obliquely to the shaft or axle 24 so that, upon rotation of the shaft, the mirror wobbles or rotates in a plurality of planes. With momentary reference to FIG. 4a, an alternate system for producing "wobble" in the mirror 23 may be seen. In the alternate arrangement, two shafts 24', which may be equipped with camming surfaces between the mirror 23 and the electric motor, are provided in addition to the central shaft 24.

The precise details of the laser source, the motor, and the wobble-plate mirror, are not, in themselves, subjects of the present invention and other types of such components could be used provided that the operative characteristics, in combination, are as set forth. However, one laser found to be particularly useful is a SYLVANIA Model 971, $CO_2$ Gas Transport Laser. It operates at a wavelength of 10.6 microns in one mode, with a maximum power output of 1000 watts. The gas is premixed; 78.92% helium, 17.1% nitrogen, and 3.98% carbon dioxide. The optical cavity in the Gas Transport Laser has a total length of approximately 9 meters between the end mirrors. Folding mirrors at each end force seven passes through the discharge region. The beam diameter is specified to be 13 millimeters with a beam jitter of less than 0.6 milliradian. The power supply for the system is direct current with 0 to 1750 volt capacity. Its maximum capability is 3.5 kilowatts—approximately one and a half times that required to drive the laser at the rated power. Power output stability is ±5%.

At 27, is shown a table or jig for holding the sample 28 to be skived. Suitable clamping means 31 are provided for holding the sample 28 and a mask 6 in place during the skiving operation. The table 27 is linearly movable in the direction of the arrows at rates in the range of 0.00–0.75 c.m./sec. Any suitable linkage and drive means may be utilized for control of linear movement of the table. As may be readily appreciated from FIG. 4, the components of the laser beam "a" and "b" are directed by the parabolic mirror into converging patterns onto the rotating mirror 23 from which they continue to converge to a focused point "c" at the surface to be skived. At "c'" may be seen a displaced focal point which results from incidence of the beam components "a" and "b" upon the mirror 23 as it rotates from the plane 23' to the plane 23" due to its oblique connection to the shaft 24. Thus, a beam is created which nutates from the surface of the mirror 23 to a circle having a diameter C—C'.

Figure 7:
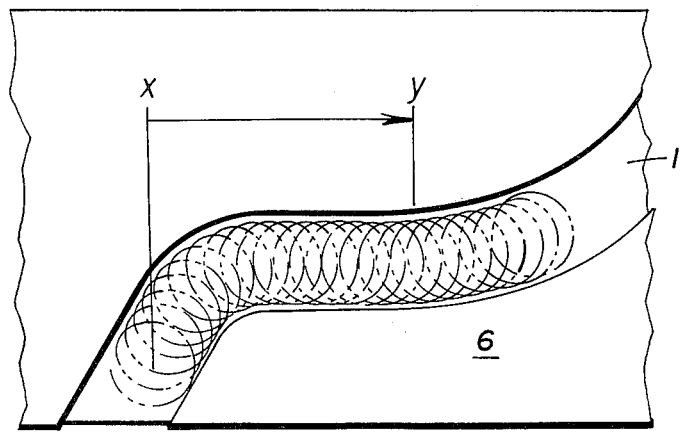
FIG. 7 is an enlarged partial plan view similar to FIG. 2, and showing the path taken by the skiving beam as it moves across the sample.

With reference to FIG. 7, which shows a partial elevation of the clamped work piece of FIG. 4, phantom lines demarcate the overlapping circular sweep pattern of the laser beam focal points "c", "c'" upon the surface of the plastic layer 1. The incidence of the converging beam components on the rotating mirror 23 causes a conical beam projection from the mirror to the work surface 1.

Linear movement, occasioned by movement of the table 27 in the directions shown, is from the point X to the point Y. Such linear movement of the work piece, concurrently with the nutating beam pattern, produces the trace shown in phantom which comprises a series of overlapping circles. It is this overlapping circular pattern and the linear movement of the sample which provides a minimization of exposure time to the high intensity laser beam and which produces the precise cutting depth and edge clarity achievable only with the present invention.

The present invention contemplates, of course, that the sweep area, and the speeds of both the rotating mirror and the moving table are all adjustable depending upon the particular requirements of a given sample. It is apparent that skiving depth and speed may be selectably varied through the judicious control of one or more of such parameters.

Figure 5:
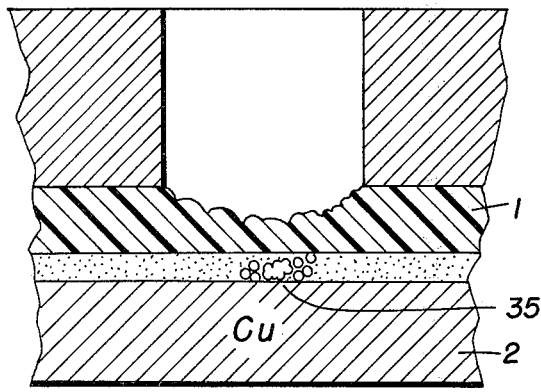
FIG. 5 is a greatly enlarged sectional view of the sample to be skived, similar to that of FIG. 1, but showing an open mask area and showing the effects of light energy absorption by the layers of material.

The actual physical processes through which the instant invention operates may be readily appreciated with concurrent reference to FIGS. 5 and 6. FIGS. 5 and 6 show a greatly enlarged sectional view of a small portion of the sample shown in FIG. 4.

In FIG. 5, beam exposure has just begun. It may be noted, that the resin layer 3 has already absorbed more heat energy than the Kapton layer 1. This results in a vaporization of the resin layer and the production of gas in the area 35 and light pressure between the plastic layer and the copper substrate 2. It may also be noted that some of the upper surface of the Kapton layer has begun to evaporate, reducing its thickness appreciably.

With reference to FIG. 6, one may note that, when substantial vaporization and thickness reduction of the plastic layer has reduced its strength sufficiently, the gas produced by the resin vaporization at 35 literally "explodes" through the open area of the mask 6 carrying with it any particulate from the resin and plastic layers which has not vaporized and leaving the surface of the copper substrate clean and undisturbed by exposure from the laser beam. It may also be noted that the edges of the plastic and resin layers are precisely coterminous with the edges of the open mask area. This result may be compared with the results obtainable through prior art skiving methods, such as that shown in FIG. 3.

In a typical installation, good results may be obtained by skiving the Kapton and FEP layers from a copper substrate using the following parameters. Utilizing a continuous wave $CO_2$ gas transport laser having a laser intensity of $7.73 \times 10^4$ w/cm$^2$, the table 27 could be moved at the rate of 0.50 cm/sec. and the nutating beam diameter produced by the mirror 23 would be 19 mm. It is critically important that the mask thickness be kept to an absolute minimum. The best edge quality is obtainable with a mask 6 having a thickness of no more than 1 mm. The rotational speed of the mirror 23 can be held at 2,000 r.p.m. With these parameters, no charring or burning will occur and extremely clean edges and copper substrate surfaces will be obtained.

Thus, the preferred embodiments of the invention have been illustrated and described. It must be clearly understood that the preferred embodiments are capable of variation and modification and are not limited to the precise details set forth. For instance, it is apparent that the apparatus and procedure for using same is not limited to Kapton over FEP over copper laminates. Any plastic over metal substrate can be treated. For example, the apparatus has been successfully utilized for removing Kapton over aluminum, in solar cells encapsulated in plastic, and in plastic over silver substrates with no damage to the silver areas. Polyester over copper has also been successfully treated. This invention includes all such variations and modifications as fall within the scope of the appended claims.

We claim:

1. A method of removing selected portions of a plastic cover layer which is attached to a metallic substrate by means of an adhesive material, without vaporizing the metallic substrate, comprising the steps of:

(a) masking said plastic cover layer such that only said selected portions are exposed;

(b) exposing said selected portions to a rotating beam of high intensity light energy;

(c) controlling said beam in intensity, duration, and point of application such that said selected portions and said adhesive material absorb more infrared light energy than is absorbed by said metallic substrate and said metallic substrate is not vaporized;

(d) causing the concurrent vaporization of said selected portions and said adhesive material to produce a volume of gas under pressure between said selected portions of said cover layer and said metallic substrate such that any of said selected portions not removed by vaporization of said plastic cover layer are removed from said metallic substrate by explosion of said volume of gas produced by vaporization of said adhesive material.

2. A system for skiving a plastic cover layer off of a workpiece having a metallic substrate, without destruction of the substrate, including, in combination; laser means for producing a beam of high intensity light energy, reflection means for accepting said beam from said laser means and transmitting said beam to a plurality of specific points of application on said workpiece for precisely skiving selected portions of said plastic cover layer, said reflection means including first mirror means for transmitting said beam to said workpiece in a moving pattern, rotation and wobble means for causing said first mirror means to rotate and to concurrently wobble within a plurality of different planes of rotation, table means for supporting said workpiece and for selectively linearly moving said workpiece during said skiving of said selected portions, control means for controlling said movement of said table means and said movement of said first mirror means, the combined effects of movements of said table means and said first mirror means producing a beam sweep trace of said plurality of specific points characterized by a plurality of overlapping circles on said selected portions of said plastic cover layer, said beam sweep trace exposing said plurality of specific points in a selectively duration controlled transitory manner.

3. The invention of claim 2 wherein said first mirror means include a flat surfaced disc-shaped mirror at least partially mounted upon shaft means, said shaft means being connected to motor means for drivingly rotating said disc-shaped mirror.

4. The invention of claim 2 further including mask means having at least one specifically defined opening therein for permitting the passage of light energy therethrough and having at least one specifically defined closed portion for blocking the passage of light energy, said mask means being adapted for attachment to said workpiece in proximate contact with said plastic cover layer for permitting said beam to skive only said selected portions of said plastic cover layer.

5. The invention of claim 2 wherein said reflection means include second mirror means for transmitting said beam from said laser means to said first mirror means.

6. The invention of claim 5 wherein said second mirror means include a relatively fixed parabolic mirror.

7. The invention of claim 2 wherein said table means include means for selectively linearly moving said workpiece in a plurality of directions during said skiving of said selected portions, fastening means for firmly removably attaching said workpiece to said table means.

8. The invention of claim 2 wherein said reflector means of said system further function to transmit said beam to said plurality of specific points in controlled duration and further means function to control the intensity of said laser means so that said selected portions of said plastic cover layer absorb more of the infrared portions of said beam than are absorbed by said metallic substrate and said portions of said plastic cover layer are skived by means of a combination of vaporization of the plastic cover layer and explosion processes.

* * * * *